United States Patent
Lu et al.

(10) Patent No.: US 7,089,677 B2
(45) Date of Patent: Aug. 15, 2006

(54) METHOD FOR CALIBRATING ALIGNMENT MARK POSITIONS ON SUBSTRATES

(75) Inventors: Ching-Shan Lu, An Dien, Tainan (TW); Chien-Yao Kao, Kaohsiung (TW); Fu-Su Lee, Siogying (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 63 days.

(21) Appl. No.: 10/840,093

(22) Filed: May 5, 2004

(65) Prior Publication Data

US 2005/0246915 A1    Nov. 10, 2005

(51) Int. Cl.
*G01D 21/00*    (2006.01)

(52) U.S. Cl. ........................................ 33/645; 414/936

(58) Field of Classification Search .................. 33/613, 33/645; 257/797; 438/401; 414/936
See application file for complete search history.

(56) References Cited

U.S. PATENT DOCUMENTS

| | | | | |
|---|---|---|---|---|
| 4,635,373 A | * | 1/1987 | Miyazaki et al. | 33/645 |
| 4,676,649 A | * | 6/1987 | Phillips | 356/401 |
| 5,452,521 A | * | 9/1995 | Niewmierzycki | 33/520 |
| 5,696,835 A | * | 12/1997 | Hennessey et al. | 382/141 |
| 5,917,601 A | * | 6/1999 | Shimazaki et al. | 356/622 |
| 5,929,529 A | * | 7/1999 | Takizawa | 257/797 |
| 6,177,330 B1 | * | 1/2001 | Yasuda | 438/401 |
| 6,180,424 B1 | * | 1/2001 | Tigelaar et al. | 438/14 |
| 6,242,318 B1 | * | 6/2001 | Mugibayashi et al. | 438/401 |
| 6,301,798 B1 | * | 10/2001 | Liu et al. | 33/645 |
| 6,339,730 B1 | * | 1/2002 | Matsushima | 700/218 |
| 6,357,131 B1 | * | 3/2002 | Cheng et al. | 33/645 |
| 6,436,726 B1 | * | 8/2002 | Look et al. | 438/17 |
| 6,568,098 B1 | * | 5/2003 | Beckhart et al. | 33/645 |
| 6,914,337 B1 | * | 7/2005 | Chuang et al. | 257/797 |
| 7,008,802 B1 | * | 3/2006 | Lu | 438/7 |

* cited by examiner

*Primary Examiner*—Diego Gutierrez
*Assistant Examiner*—Amy R. Cohen
(74) *Attorney, Agent, or Firm*—Tung & Associates

(57) ABSTRACT

A novel method for determining whether substrates are correctly positioned on a substrate support in a semiconductor substrate processing or measuring tool for optimum processing or measuring of the substrates. The method includes providing a control substrate; providing alignment marks on the substrate; determining a homing position for the alignment marks on the control substrate wherein the position of the control substrate corresponds to a homing position for optimum processing or measuring of actual substrates; periodically testing the position of the control substrate on the substrate support as facilitated by the substrate transfer and/or substrate positioning equipment of the tool; and determining whether the position of the alignment marks on the control substrate, with respect to the substrate support, stray outside an accepted deviation range.

19 Claims, 1 Drawing Sheet

METHOD FOR CALIBRATING ALIGNMENT MARK POSITIONS ON SUBSTRATES

FIELD OF THE INVENTION

The present invention relates to processes for fabricating integrated circuits on semiconductor wafer substrates. More particularly, the present invention relates to a method for calibrating the positions of alignment marks on substrates to monitor and correct positional shifting of substrates on a stage or support during processing.

BACKGROUND OF THE INVENTION

In the fabrication of semiconductor integrated circuits, metal conductor lines are used to interconnect the multiple components in device circuits on a semiconductor wafer. A general process used in the deposition of metal conductor line patterns on semiconductor wafers includes deposition of a conducting layer on the silicon wafer substrate; formation of a photoresist or other mask such as titanium oxide or silicon oxide, in the form of the desired metal conductor line pattern, using standard lithographic techniques; subjecting the wafer substrate to a dry etching process to remove the conducting layer from the areas not covered by the mask, thereby leaving the metal layer in the form of the masked conductor line pattern; and removing the mask layer typically using reactive plasma and chlorine gas, thereby exposing the top surface of the metal conductor lines. Typically, multiple alternating layers of electrically conductive and insulative materials are sequentially deposited on the wafer substrate, and conductive layers at different levels on the wafer may be electrically connected to each other by etching vias, or openings, in the insulative layers and filling the vias using aluminum, tungsten or other metal to establish electrical connection between the conductive layers.

Semiconductor manufacturing equipment is used to process semiconductor wafers into electronic devices. The equipment includes multiple specialized processing chambers each of which is typically accessible from a central wafer transfer chamber. The wafers are usually loaded into the processing system using a wafer carrier, and into and between the various processing chambers using a transfer mechanism such as a robot. Movement of the wafers throughout the processing system is accomplished using automated handling equipment.

The cost, time and other constraints imposed on the semiconductor fabrication process dictate that the volume, or "footprint space", of processing equipment be kept at a minimum. Because of this, clearances and tolerances in the processing equipment must be minimized. Proper centering and positioning of semiconductor wafers on a wafer chuck, stage or support is essential for proper wafer processing in order to avoid costly errors such as non-uniform processing and/or wafer breakage. During semiconductor device processing, a wafer must be accurately centered on a wafer support platform or chuck in order to ensure that the wafer will receive uniform processing (such as uniform layer distribution) across its entire face or to ensure that the wafer chuck will not be damaged. Similarly, due to the rapid decrease in mechanical tolerances associated with continually decreasing the footprint space of processing equipment, a wafer must be accurately centered on the transfer mechanism or robot to avoid breakage caused by a wafer falling or striking a wafer component during transport.

Unfortunately, with the limited space and clearances which characterize processing equipment, wafers frequently become misaligned during transport. As a result, the wafer transfer robot may place the wafer in a misaligned position on the wafer support inside the processing chamber. Moreover, over repeated use the wafer transfer robot may gradually drift from parameter specifications and place the wafers in misaligned positions on the wafer support. Semiconductor wafers frequently include a notch or flat area which is engaged by wafer-aligning equipment to facilitate proper wafer alignment or orientation for circuit pattern development and fabrication. These notches are aligned so as to be in the appropriate location with respect to the chamber components for proper processing. As with the wafer transport robot, the notch-engaging wafer-aligning equipment in the chamber may gradually drift from parameter specifications and result in malpositioning of the wafer on the support.

One of the most problematic circumstances in which a substrate is misaligned on a substrate support occurs as the substrate is loaded and positioned by a transfer robot into an ellipsometry tool in order to measure the thickness of an ultra-thin gate oxide layer on the substrate. Malpositioning of the substrate on the substrate support inside the tool results in faulty ellipsometry measurement data for the thickness of the gate oxide layer. Accordingly, a method is needed for determining whether the placement position for substrates on a substrate support strays beyond acceptable deviation ranges for optimum substrate measurement or processing. A method is further needed for expediently re-configuring the substrate position from the misaligned position to the correct position on the substrate support for optimum substrate measurement or processing.

An object of the present invention is to provide a novel method for ensuring proper positioning of substrates on a substrate support.

Another object of the present invention is to provide a novel method for calibrating a homing position for substrate positioning equipment in a processing or measuring tool to facilitate optimum processing or measurement of substrates on a substrate support.

Still another object of the present invention is to provide a novel method for determining whether a position of substrates on a substrate support strays beyond acceptable ranges for optimum substrate measurement or processing.

Yet another object of the present invention is to provide a novel method for preventing inaccurate measurement or processing of substrates.

A still further object of the present invention is to provide a method which includes providing a pair of alignment marks on a control wafer, establishing homing coordinate positions for each of the alignment marks when the substrate is properly positioned on a substrate support for optimum processing or measurement, periodically monitoring test coordinate positions for each of the alignment marks after automated transfer of the substrates onto the support, and determining whether the test coordinate positions deviate from the homing coordinate positions within an acceptable range.

Yet another object of the present invention is to provide a novel method for re-configuring substrates from a misaligned center coordinate position and radial orientation to a homing center coordinate position and radial orientation for optimum substrate measurement or processing.

A still further object of the present invention is to provide a novel method for determining coordinate positions of a center of a misaligned substrate, as well as the degree of shift or misalignment in the radial orientation of the substrate with respect to a homing radial orientation, in order to facilitate expedient re-calibration of the substrate positionining equipment from the misaligned position back to the homing position.

SUMMARY OF THE INVENTION

These and other objects of the invention are generally directed to a method which, in one embodiment, is generally directed to a novel method for determining whether substrates are correctly positioned on a substrate support in a semiconductor substrate processing or measuring tool for optimum processing or measuring of the substrates. The method includes providing a control substrate; providing alignment marks on the substrate; determining a homing position for the alignment marks on the control substrate wherein the position of the control substrate corresponds to a homing position for optimum processing or measuring of actual substrates; periodically testing the position of the control substrate on the substrate support as facilitated by the substrate transfer and/or substrate positioning equipment of the tool; and determining whether the position of the alignment marks on the control substrate, with respect to the substrate support, stray outside an accepted deviation range. In the event that the test positions of the alignment marks fall outside the accepted deviation range, the substrate-positioning and/or substrate transfer equipment of the process tool may be re-calibrated to position the control substrate back to the homing position on the substrate support.

In another embodiment, the present invention includes a method which facilitates expedited re-calibration of substrate transfer and/or positioning equipment in the event that positioning of the control substrate on a substrate support drifts beyond a homing position in which the position of the control substrate corresponds to a position conducive to optimum processing or measurement of actual substrates. The method includes providing a control substrate; providing alignment marks on the control substrate; determining a homing position for the alignment marks wherein the position of the control substrate corresponds to a position conducive to optimum processing or measurement of actual substrates; periodically testing the positions of the alignment marks on the control substrate as facilitated by the substrate transfer and/or substrate positioning equipment of the tool; calculating the location of the shifted center of the control substrate with respect to the homing position of the control substrate and the radial orientation shift of the alignment marks with respect to the homing position; and using the shifted center location and the radial orientation shift of the control substrate to re-calibrate the substrate transfer and/or positioning equipment in such a manner that the control substrate and actual substrates are positioned at the homing position for optimum substrate processing or measurement.

BRIEF DESCRIPTION OF THE DRAWINGS

The invention will now be described, by way of example, with reference to the accompanying drawings, in which.

DESCRIPTION OF THE PREFERRED EMBODIMENTS

Figure 1:
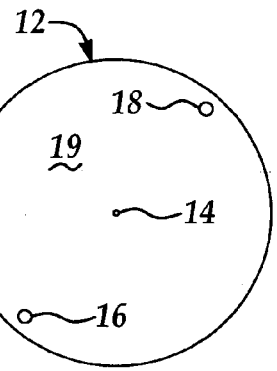
FIG. 1 is a top view of a control substrate with alignment marks suitable for implementation of a first embodiment of the method of the present invention.

In one embodiment, the present invention is generally directed to a novel method for ensuring proper positioning of substrates on a substrate support in a process or measuring tool to facilitate optimum processing or measurement of the substrates. The method includes providing alignment marks on a control substrate; establishing homing x and y coordinates for each of the alignment marks when the substrate transfer and/or positioning equipment of the tool is calibrated to place the control substrate at a homing position which corresponds to a position conducive to optimum processing and measurement of actual substrates; periodically positioning the control substrate on the substrate support using the substrate transfer and/or positioning equipment of the process or measuring tool to establish test x and y coordinates for each of the alignment marks; determining displacement distances between the homing x and y coordinates and the test x and y coordinates, respectively; determining whether the displacement distances fall within an acceptable deviation range; and re-calibrating the automated substrate positioning equipment back to the homing position in the event that the displacement distances fall outside the acceptable deviation range.

The method may further include establishing a homing radial orientation of at least one of the alignment marks when the substrate is at the homing position on the substrate support; periodically positioning the control substrate on the substrate support using the substrate transfer and/or positioning equipment of the process or measuring tool to establish a test radial orientation for the alignment mark or marks; determining a radial orientation shift between the homing radial orientation and the test radial orientation; determining whether the radial orientation shift falls within an acceptable deviation range; and re-calibrating the automated substrate transfer and/or positioning equipment back to the homing position in the event that the radial orientation shift falls outside the acceptable deviation range.

Another embodiment of the present invention is directed to a method which facilitates expedited re-calibration of substrate transfer and/or positioning equipment when substrates are improperly positioned on a substrate support for optimum substrate measurement or processing. The method includes providing alignment marks on a control substrate; establishing homing x and y coordinates for each of the alignment marks and a homing radial orientation for at least one of the alignment marks when the substrate transfer and/or positioning equipment is calibrated to a homing position which corresponds to a position conducive to optimum processing and measurement of actual substrates; periodically positioning the control substrate on the substrate support using the substrate positioning equipment to establish test x and y coordinates for each of the alignment marks and a test radial orientation for at least one of the alignment marks; determining a radial orientation shift for at least one of the alignment marks; calculating a test coordinate for the center of the control substrate using a mathematical equation having variables for the homing x and y coordinates, the test x and y coordinates and the radial orientation shift; and using the center coordinate shift of the control substrate to re-calibrate the automated substrate positioning equipment.

Referring initially to FIGS. 1–4, according to a first embodiment the method of the present invention includes the use of a control substrate 12 which may be a standard patterned silicon wafer and has a pair of alignment marks 16, 18 provided on the upper surface 19 of the control substrate 12. The alignment marks 16, 18 may be provided on opposite sides of the control substrate 12, typically in diametrically-opposed relationship to each other. The alignment marks 16, 18 may be laser-etched or otherwise provided on the control substrate 12 according to techniques known by those skilled in the art.

As hereinafter described, the control substrate 12 is placed on a substrate support 10, shown in FIGS. 2 and 3, inside a processing or measuring tool (not shown). For example, the control substrate 12 may be placed on a substrate support (not shown) in a testing chamber of an ellipsometer, for example, used to measure the thickness of gate oxide layers provided on the surface of actual substrates. The processing or measuring tool may include a transfer robot (not shown) which transfers wafers onto the substrate support 10, as well as substrate positioning equipment (not shown) which engages a notch (not shown) provided in the substrate and positions each substrate on the substrate support 10 for optimum processing or testing of the substrates.

In accordance with the method of the invention, the substrate support 10 is divided by a cartesian grid 20 having an X-axis 22 and a Y-axis 24 which intersect at the center 11 of the substrate support 10. The cartesian grid 20 divides the surface of the substrate support 10 into a positive-positive quadrant 26, a positive-negative quadrant 28, a negative-negative quadrant 30, and a negative-positive quadrant 32. With the center 11 defined as zero, the X-axis 22 is divided into multiple positive integers in the positive (right-handed) direction from the center 11 and multiple negative integers in the negative (left-handed) direction from the center 11. The integers are spaced at one-millimeter intervals with respect to each other such that the X-axis 22 ranges from typically –100 to +100 on respective sides of the center 11. In similar fashion, the Y-axis 24 is divided into multiple positive integers in the positive (upward) direction from the center 11 and multiple negative integers in the negative (downward) direction from the center 11. The integers are spaced at one-millimeter intervals with respect to each other such that the Y-axis 24 ranges from typically –100 to +100 on respective sides of the center 11. Accordingly, X and Y coordinates ranging from 0,0 to 100, 100 lie within the positive-positive quadrant 26; coordinates ranging from 0,0 to 100,–100 lie within the positive-negative quadrant 28; coordinates ranging from 0,0 to –100,–100 lie within the negative-negative quadrant 30; and coordinates ranging from 0,0 to –100, +100 lie within the negative-positive quadrant 32.

Figure 3:
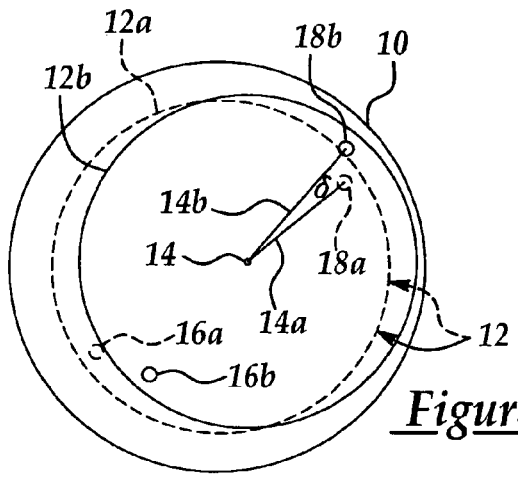
FIG. 3 is a top view of a substrate support, with a control substrate resting thereon and illustrating a homing position (in phantom) of the control substrate on the substrate support and a shifted, test position (in solid lines) of the control substrate on the substrate support.

Next, as shown in FIG. 3, the substrate transfer and/or positioning equipment of the processing or measuring tool is calibrated in such a manner that the control wafer 12 is placed on the substrate support 10 in a homing position 12a (indicated by the phantom lines in FIG. 3) which corresponds to a position that is conducive to optimal processing or measurement of actual substrates. Such calibration methods are well-known by those skilled in the art and vary according to the type of processing or measuring tool in question. Next, as the control wafer 12 remains in the homing position 12a, homing x and y coordinates are established, according to the cartesian grid 20, for the respective alignment marks 16, 18 at the homing position 16a, 18a of each. The control substrate 12 is then removed from the substrate support 10 and the process or measuring tool, and processing or measuring of actual substrates commences.

Throughout the course of processing or measuring actual substrates on the substrate support 10 in normal operation of the processing or measuring tool, shift tests are periodically carried out using the control substrate 12, as hereinafter described. The shift tests may be carried out once per day, for example, and determine whether the parameter specifications of the substrate transfer and/or positioning equipment of the process or measuring tool have drifted beyond acceptable deviation ranges for the previously-calibrated homing specifications. If the parameter specifications of the equipment have drifted beyond the calibrated homing specifications, the equipment places the control substrate 12 in a test position 12b which is misaligned with respect to the homing position 12a of the control substrate 12 on the substrate support 10, as indicated by the solid lines in FIG. 3. Accordingly, as the control substrate 12 remains on the substrate support 10, test X and Y coordinates are established for the respective alignment marks 16, 18 at the respective test positions 16b, 18b, using the cartesian grid 20.

After the test X and Y coordinates are established for the alignment marks 16, 18 at the respective test positions 16b, 18b, an X shift and a Y shift for each of the alignment marks 16, 18 is determined as follows. The X shift for the alignment mark 16 is measured by determining the distance in millimeters along the X axis 22 of the cartesian grid 20, between the X coordinate of the homing position 16a and the X coordinate of the test position 16b. In similar manner, the X shift for the alignment mark 18 is measured by determining the distance in millimeters along the X axis 22 of the cartesian grid 20, between the X coordinate of the homing position 18a and the X coordinate of the test position 18b. The Y shift for the alignment mark 16 is measured by determining the distance in millimeters along the Y axis 24 of the cartesian grid 20, between the Y coordinate of the homing position 16a and the Y coordinate of the test position 16b. Finally, and in like manner, the Y shift for the alignment mark 18 is measured by determining the distance in millimeters along the Y axis 24 of the cartesian grid 20, between the Y coordinate of the homing position 18a and the Y coordinate of the test position 18b. The radial orientation shift of the control substrate 12 may further be determined by measuring the angle, between a straight line 14a extending from the substrate center 14 to the homing position 18a and a straight line 14b extending from the substrate center 14 to the test position 18b of the control substrate 12, as further shown in FIG. 3.

Figure 4:
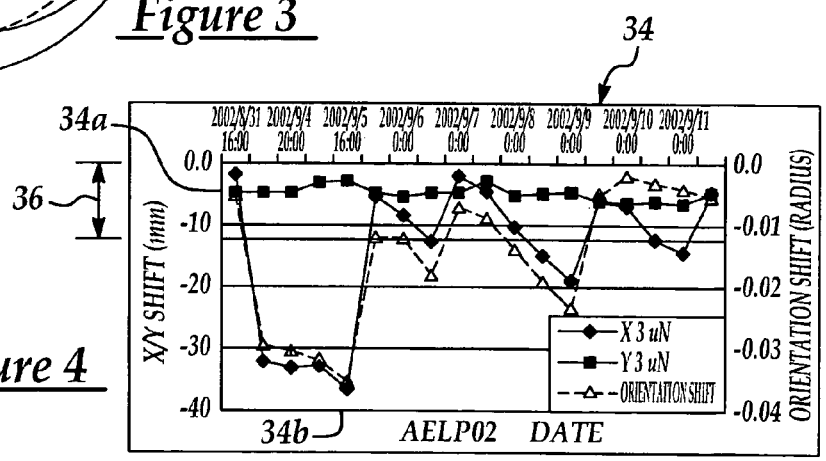
FIG. 4 is an SPC (Statistical Process Control) chart used to monitor position shifts in the alignment marks on the control substrate between homing x and y coordinates and test x and y coordinates, according to a first embodiment of the method of the present invention.

The X shift and Y shift for either or both of the alignment mark 16 and the alignment mark 18 are plotted as X/Y shift, in millimeters, along the Y-axis 34a at the left-hand edge of an SPC (Statistical Process Control) chart 34, which is shown in FIG. 4. In the SCP chart 34 of FIG. 4, the X shift and Y shift of the alignment mark 18 are plotted and the X shift and Y shift of the alignment mark 16 are omitted. The radial orientation shift angle, in degrees, between the homing position 18a and the test position 18b of the alignment mark 18 may be plotted along the Y-axis 34a at the right-hand edge of the SPC chart 34. The dates of the respective shift tests are plotted along the X-axis 34b of the SPC chart 34.

In the event that either or both of the X shift and the Y shift of the alignment mark 18 fall outside a predetermined deviation range 36, for example, outside the range of from about 0.0 mm to about 0.12 mm, as indicated in the SPC chart 34, corrective calibration measures are taken to return the operational parameters of the substrate transfer and/or positioning equipment to within the previously-set homing calibration specifications. This ensures that actual substrates are again properly positioned on the substrate support 10 by the substrate transfer and/or positioning equipment for optimal processing or measuring. In similar fashion, in the event that the radial orientation shift angle falls outside the deviation range 36, corrective calibration measures may likewise be taken to return the operational parameters of the substrate transfer and/or positioning equipment to within the previously-set homing calibration specifications.

The method will be better understood by reference to the following example:

EXAMPLE

A control substrate having a pair of alignment marks was prepared. Substrate positioning equipment was calibrated to position the control substrate on a substrate support of a process tool wherein the first alignment mark was disposed at the homing coordinates (77.864, 54.639) and the second alignment mark was disposed at the homing coordinates (−78.064, −54.138). After two days of normal use of the process tool to process actual substrates, the substrate positioning equipment was tested using the control substrate. The test coordinates for the first alignment mark were (77.764, 53.615), whereas the test coordinates for the second alignment mark were (−78.268, −54.049). The X shift for the first alignment mark was 0.100 mm (77.864–77.764), and the Y shift for the first alignment mark was 1.024 mm (54.639–53.615). The X shift for the second alignment mark was −0.204 [−78.064−(−78.268)]. The Y shift for the second alignment mark was −0.089. The X shift and the Y shift of both the first alignment mark and the second alignment mark were compared to a deviation range of from 0.0 mm to 0.12 mm. Because the Y shift (1.024 mm) of the first alignment mark exceeded the 0.12 mm limit for the deviation range, the substrate positioning equipment was re-calibrated to the previously-set homing specifications for optimum processing of substrates.

EXAMPLE

Figure 2:
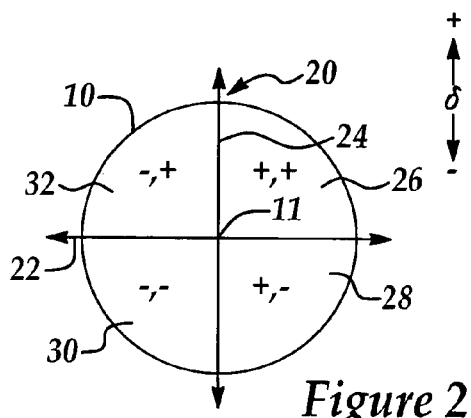
FIG. 2 is a schematic illustrating a substrate support divided into four coordinate quadrants to establish homing x and y coordinates and test x and y coordinates for alignment marks on a control substrate, according to a first embodiment of the method of the present invention.
Figure 5:
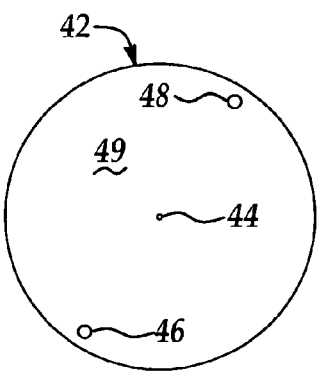
FIG. 5 is a top view of a control substrate with alignment marks suitable for implementation of a second embodiment of a method of the present invention.
Figure 6:
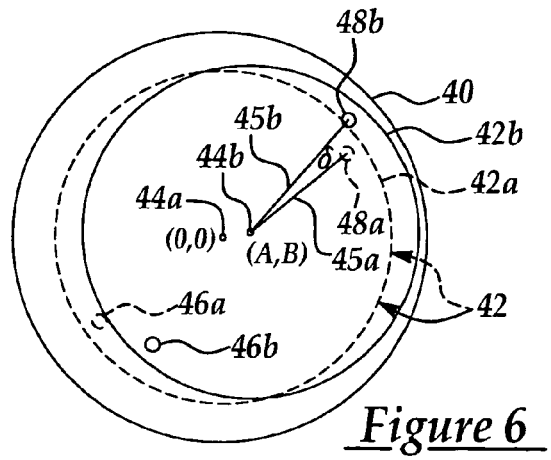
FIG. 6 is a top view of a substrate support, with a control substrate resting thereon and illustrating a homing position (in phantom) of the control substrate on the substrate support and a shifted, test position of the control substrate (in solid lines) on the substrate support, more particularly illustrating a technique for re-calibrating substrate transfer and/or positioning equipment from a shifted, test position back to a homing position.

Referring next to FIGS. 2, 5 and 6, another embodiment of the present invention is directed to a method which facilitates expedited re-calibration of substrate transfer and/or positioning equipment when substrates are improperly positioned on a substrate support 40 for optimum substrate measurement or processing. The method is used to calculate, on a cartesian grid, the X and Y coordinates of the center of a control substrate 42 disposed in a misaligned position on the substrate support 40. Ascertaining the center coordinates of the misaligned control substrate 42 enables equipment operating personnel to determine the coordinate shift of the substrate center and expeditiously re-calibrate the substrate transfer and/or positioning equipment back to a homing position wherein substrates are properly positioned on the substrate support for optimum processing or measuring.

The method includes providing a pair of alignment marks 46, 48 on the control substrate 42, which may be a silicon wafer and has a substrate center 44. The alignment marks 46, 48 may be provided on the upper surface 49 of the control substrate 42, typically in substantially diametrically-opposed relationship to each other. The alignment marks 46, 48 may be laser-etched in the control substrate 42, for example, or may be provided in the control substrate 42 using alternative methods known by those skilled in the art.

The substrate transfer and/or positioning equipment is calibrated to a homing position which corresponds to a position conducive to optimum processing and measurement of actual substrates. When the substrate transfer and/or positioning equipment is so calibrated, the control substrate 42 is placed in a homing position 42a on the substrate support 40, wherein the alignment marks 46, 48 are disposed at respective homing positions 46a, 48a, as shown in FIG. 6. By use of the cartesian grid 20 of FIG. 2, and with the substrate center 44 of the control substrate 42 disposed at a homing center position 44a which corresponds to the coordinates (0,0) on the cartesian grid 20, homing x and y coordinates for each of the homing positions 46a, 48a are determined. The control substrate 42 is removed from the substrate support 40 and normal processing or measuring of actual substrates resumes.

Throughout the course of processing or measuring actual substrates on the substrate support 40 in normal operation of the processing or measuring tool, shift tests are periodically carried out using the control substrate 42, as heretofore described with respect to FIGS. 1–3. The shift tests determine whether the parameter specifications of the substrate transfer and/or positioning equipment of the process or measuring tool have drifted beyond acceptable deviation ranges for the previously-calibrated homing specifications. If the parameter specifications of the equipment have drifted beyond the calibrated homing specifications, the equipment places the control substrate 42 in a test position 42b which is misaligned with respect to the homing position 42a of the control substrate 42 on the substrate support 40, as indicated by the solid lines in FIG. 6. Accordingly, the alignment marks 46, 48 are disposed at respective test positions 46b, 48b which are offset with respect to the respective homing positions 46a, 48a. Additionally, the substrate center 44 is disposed at a test center position 44b which is offset with respect to the homing center position 44a. As the control substrate 42 remains on the substrate support 40, test X and Y coordinates are established for the respective alignment marks 46, 48 at the respective test positions 46b, 48b, using the cartesian grid 20. The X and Y shift for each of the alignment marks 46, 48 is then determined and the X and Y shift of one or both of the alignment marks 46, 48 is plotted on the SPC chart 34, in the same manner as heretofore described with respect to FIG. 4. The radial orientation shift of the control substrate 42 is determined by measuring the angle, between a straight line 45a extending from the test center position 44b to the homing position 48a and a straight line 45b extending from the test center position 44b to the test position 48b of the control substrate 42, as further shown in FIG. 6. The radial orientation shift may further be plotted on the SPC chart 34, as heretofore described.

In the event that either or both of the X shift and the Y shift of the alignment marks 46, 48 fall outside a predetermined deviation range 36, for example, outside the range of from about 0.0 mm to about 0.12 mm, as indicated in the SPC chart 34, corrective calibration measures are taken to return the operational parameters of the substrate transfer and/or positioning equipment to within the previously-set homing calibration specifications. This ensures that actual substrates are again properly positioned on the substrate support 10 by the substrate transfer and/or positioning equipment for optimal processing or measuring. In similar fashion, in the event that the radial orientation shift angle falls outside the deviation range 36, corrective calibration measures may likewise be taken to return the operational parameters of the substrate transfer and/or positioning equipment to within the previously-set homing calibration specifications.

Corrective calibration of the substrate transfer and/or positioning equipment may be expedited by calculating the X and Y coordinates for the substrate center 44 at the test center position 44b, designated (A,B). With those coordinates, equipment operating personnel can easily determine the center X and Y coordinate shift and use this information to re-calibrate the substrate transfer and/or positioning equipment back to the home position. The X and Y coordinates (the variables A and B, respectively in the following mathematical formulas) on the cartesian grid 20 for the substrate center 44 at the test center position 44b are calculated using the following mathematical formulas:

$$X1=A+R1*\cos(1+) \quad X2=A+R2*\cos(1+)$$

$$Y1=B+R1*\sin(1+) \quad Y2=B+R2*\sin(2+),$$

where X1=the X coordinate for the test position 46b of the alignment mark 46; Y1=the Y coordinate for the test position 46b of the alignment mark 46; X2=the X coordinate for the test position 48b of the alignment mark 48; Y2=the Y coordinate for the test position 48b of the alignment mark 48; R1=the X coordinate for the homing position 46a of the alignment mark 46; 1=the Y coordinate for the homing position 46a of the alignment mark 46; R2=the X coordinate for the homing position 48a of the alignment mark 48; 2=the Y coordinate for the homing position 48a of the alignment mark 48; A=the X coordinate for the test center position 44b of the substrate center 44; B=the Y coordinate for the test center position 44b of the substrate center 44; and=the angle of radial orientation shift between the alignment mark 48 at the homing position 48a and the alignment mark 48 at the test position 48b.

The calculated values (A,B) for the respective X and Y coordinates of the substrate center 44 at the test center position 44b represent the substrate center shift of the substrate center 44 from the homing center position 44a to the test center position 44b, since the X and Y coordinates of the homing center position 44a are (0,0). The values (A,B) may then be used by the positioning equipment operating personnel to re-calibrate the equipment in such a manner that the control substrate 42, and actual substrates processed or measured in the tool, are again positioned in the homing position 42a on the substrate support 40, as heretofore described with respect to the control substrate 42 in FIG. 6.

While the preferred embodiments of the invention have been described above, it will be recognized and understood that various modifications can be made in the invention and the appended claims are intended to cover all such modifications which may fall within the spirit and scope of the invention.

What is claimed is:

1. A method for testing a transfer position of a substrate on a substrate support following transfer of said substrate to said substrate support, said substrate support for supporting said substrate during processing, comprising the steps of:
   providing a control substrate having first and second alignment marks;
   providing said control substrate in a homing position on the substrate support;
   providing said control substrate in a test position on the substrate support; and
   measuring a displacement between said first alignment mark at said homing position of said control substrate and said first alignment mark at said test position of said control substrate.

2. The method of claim 1 further comprising the step of measuring a second displacement between said second alignment mark at said homing position of said control substrate and said second alignment mark at said test position of said control substrate.

3. The method of claim 1 further comprising the step of determining a radial orientation shift of said control substrate between said control substrate at said homing position and said control substrate at said test position.

4. The method of claim 3 further comprising the step of measuring a second displacement between said second alignment mark at said homing position of said control substrate and said second alignment mark at said test position of said control substrate.

5. The method of claim 1 wherein said alignment marks are provided in substantially diametrically opposed relationship to each other on said control substrate.

6. The method of claim 5 further comprising the step of measuring a second displacement between said second alignment mark at said homing position of said control substrate and said second alignment mark at said test position of said control substrate.

7. The method of claim 5 further comprising the step of determining a radial orientation shift of said control substrate between said control substrate at said homing position and said control substrate at said test position.

8. The method of claim 7 further comprising the step of measuring a second displacement between said second alignment mark at said homing position of said control substrate and said second alignment mark at said test position of said control substrate.

9. The method of claim 1 further comprising the steps of:
   dividing said substrate support into a cartesian grid;
   assigning a first pair of homing coordinates for said first alignment mark and a second pair of homing coordinates for said second alignment mark on said cartesian grid when said control substrate is in said homing position; and
   assigning a first pair of test coordinates for said first alignment mark and a second pair of test coordinates for said second alignment mark when said control substrate is in said test position; and
   wherein said measuring a displacement comprises the steps of determining an X shift and a Y shift between said first pair of homing coordinates and said first pair of test coordinates for said first alignment mark.

10. The method of claim 9 further comprising the step of measuring a second displacement between said second alignment mark at said homing position of said control substrate and said second alignment mark at said test position of said control substrate.

11. The method of claim 9 further comprising the step of determining a radial orientation shift of said control substrate between said control substrate at said homing position and said control substrate at said test position.

12. The method of claim 9 wherein said alignment marks are provided in substantially diametrically-opposed relationship to each other on said control substrate.

13. A method for testing a transfer position of a substrate on a substrate support, said substrate support for supporting said substrate during processing following transfer of said substrate to said substrate support, comprising the steps of:
   providing a control substrate having first and second alignment marks on said control substrate surface;
   positioning said control substrate in a homing position on the substrate support;
   determining first position coordinates for said first and second alignment marks;
   positioning said control substrate in a test position on the substrate support;
   determining second position coordinates for said first and second alignment marks; and
   measuring a displacement between said first alignment mark at said homing position of said control substrate and said first alignment mark at said test position of said control substrate; and
   comparing said displacement to a deviation range of acceptable displacements for said substrate position following said transfer.

14. The method of claim 13 further comprising the steps of determining a radial orientation shift of said control substrate between said control substrate at said homing position and said control substrate at said test position and comparing said radial orientation shift to a deviation range of acceptable radial orientation shifts for said substrate position following said transfer.

15. The method of claim 13 wherein said alignment marks are provided in substantially diametrically-opposed relationship to each other on said control substrate.

16. The method of claim 13 further comprising the steps of:
   dividing said substrate support into a cartesian grid,
   assigning a first pair of homing coordinates for said first alignment mark and a second pair of homing coordinates for said second alignment mark on said cartesian grid when said control substrate is in said homing position, said first and second pair of homing coordinates comprising said first position coordinates; and
   assigning a first pair of test coordinates for said first alignment mark and a second pair of test coordinates for said second alignment mark when said control substrate is in said test position, said first and second pair of test coordinates comprising said second position coordinates; and
   wherein said measuring a displacement comprises the steps of determining an X shift and a Y shift between said first pair of homing coordinates and said first pair of test coordinates for said first alignment mark.

17. A method for re-calibrating a homing position of a substrate on a substrate support, said homing position comprising a desired processing position for said substrate following transfer of said substrate to said substrate support, comprising the steps of:
   positioning a control substrate in said homing position on said substrate support to determine first positioning coordinates;
   positioning said control substrate in a test position on said substrate support to determining second positioning coordinates;
   determining a substrate positioning shift comprising a displacement of said first and second positioning coordinates with respect to one another, said displacement comprising a center shift between a center of said control substrate at said homing position and said center of said control substrate at said test position; and
   re-calibrating said homing position to achieve said desired processing position following said transfer using said control substrate center shift providing first and second alignment marks on said control substrate;
   assigning a first pair of homing coordinates for said first alignment mark and a second pair of homing coordinates for said second alignment mark on said cartesian grid when said control substrate is in said homing position, said first and second pair of homing coordinates comprising said first position coordinates; and
   assigning a first pair of test coordinates for said first alignment mark and a second pair of test coordinates for said second alignment mark when said control substrate is in said test position, said first and second pair of test coordinates comprising said first position coordinates; and
   wherein test center position coordinates are determined using said first pair of homing coordinates, said first pair of test coordinates, said second pair of homing coordinates, and said second pair of test coordinates.

18. The method of claim 17 further comprising the steps of:
   dividing said substrate support into a cartesian grid;
   assigning a pair of homing center position coordinates to said center of said control substrate at said homing position of said control substrate, said pair of homing center position coordinates comprising said first position coordinates; and
   assigning a pair of test center position coordinates to said center of said control substrate at said test position of said control substrate, said pair of test center position coordinates comprising said first position coordinates; and
   wherein said substrate center shift is determined using said pair of homing center position coordinates and said test center position coordinates.

19. The method of claim 18 further comprising the step of determining a radial orientation shift of said control substrate between said control substrate at said homing position and said control substrate at said test position and wherein said test center position coordinates are determined using said first pair of homing coordinates, said first pair of test coordinates, said second pair of homing coordinates, said second pair of test coordinates and said radial orientation shift.

* * * * *